United States Patent
Lee

(10) Patent No.: US 9,941,427 B2
(45) Date of Patent: Apr. 10, 2018

(54) SOLAR CELL AND METHOD OF FABRICATING THE SAME

(75) Inventor: Jin Woo Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 153 days.

(21) Appl. No.: 13/982,195

(22) PCT Filed: Jan. 2, 2012

(86) PCT No.: PCT/KR2012/000001
§ 371 (c)(1),
(2), (4) Date: Oct. 15, 2013

(87) PCT Pub. No.: WO2012/102492
PCT Pub. Date: Aug. 2, 2012

(65) Prior Publication Data
US 2014/0034124 A1    Feb. 6, 2014

(30) Foreign Application Priority Data
Jan. 26, 2011  (KR) .................. 10-2011-0007676

(51) Int. Cl.
*H01L 31/0236*  (2006.01)
*H01L 31/0224*  (2006.01)
(Continued)

(52) U.S. Cl.
CPC .... *H01L 31/02366* (2013.01); *H01L 31/0236* (2013.01); *H01L 31/022466* (2013.01);
(Continued)

(58) Field of Classification Search
CPC ....... H01L 31/022466; H01L 31/02366; H01L 31/1888; H01L 31/0322; H01L 31/022475;
(Continued)

(56) References Cited

U.S. PATENT DOCUMENTS 4,599,482 A * 7/1986 Yamazaki ......... H01L 31/02168
136/256
5,370,747 A * 12/1994 Noguchi et al. ............. 136/259
(Continued)

FOREIGN PATENT DOCUMENTS

EP    1443527 A1    8/2004
EP    2293340 A2    3/2011
(Continued)

OTHER PUBLICATIONS

Semiconductor Band Gaps; http://hyperphysics.phy-astr.gsu.edu/hbase/Tables/Semgap.html; accessed and printed Dec. 8, 2016.*
(Continued)

*Primary Examiner* — Jeffrey T Barton
*Assistant Examiner* — Edward J. Schmiedel
(74) *Attorney, Agent, or Firm* — Saliwanchik, Lloyd & Eisenschenk

(57) ABSTRACT

Provided is a solar cell and a method of fabricating the same. The solar cell according to an embodiment includes a supporting substrate; a transparent electrode layer on the supporting substrate; a buffer layer on the transparent electrode layer; a light absorption layer on the buffer layer; a backside electrode layer on the light absorption layer; and a plurality of recesses formed on a top surface of the transparent electrode layer and having a first slope and a second slope.

9 Claims, 2 Drawing Sheets

(51) Int. Cl.
*H01L 31/032* (2006.01)
*H01L 31/18* (2006.01)
*H01L 31/0392* (2006.01)

(52) U.S. Cl.
CPC ...... *H01L 31/0322* (2013.01); *H01L 31/1888* (2013.01); *H01L 31/0392* (2013.01); *Y02E 10/541* (2013.01)

(58) Field of Classification Search
CPC ......... H01L 31/022483; H01L 31/0236; H01L 31/02363; H01L 31/0392
See application file for complete search history.

(56) References Cited

U.S. PATENT DOCUMENTS

| | | | |
|---|---|---|---|
| 6,222,117 | B1* | 4/2001 | Shiozaki ..................... 136/256 |
| 6,259,016 | B1 | 7/2001 | Negami et al. |
| 6,333,456 | B1* | 12/2001 | Yanagimachi .. H01L 31/022466 136/255 |
| 2005/0000564 | A1 | 1/2005 | Sato et al. |
| 2008/0105302 | A1* | 5/2008 | Lu .................. H01L 31/022466 136/258 |
| 2008/0178925 | A1 | 7/2008 | Wu et al. |
| 2008/0223430 | A1* | 9/2008 | Krasnov et al. ............. 136/244 |
| 2008/0308145 | A1 | 12/2008 | Krasnov et al. |
| 2010/0089444 | A1 | 4/2010 | Thomsen et al. |
| 2010/0186816 | A1 | 7/2010 | Park et al. |
| 2010/0212721 | A1 | 8/2010 | Hong |
| 2010/0267193 | A1 | 10/2010 | Lee et al. |
| 2010/0269906 | A1 | 10/2010 | Ota et al. |
| 2010/0294536 | A1* | 11/2010 | Usami ....................... 174/126.1 |
| 2011/0048533 | A1 | 3/2011 | Lee et al. |
| 2011/0056549 | A1 | 3/2011 | Berginski et al. |
| 2011/0126903 | A1 | 6/2011 | Kobayashi et al. |
| 2011/0186114 | A1 | 8/2011 | Homma et al. |
| 2011/0253213 | A1* | 10/2011 | Park ................ H01L 31/022466 136/256 |
| 2012/0097239 | A1* | 4/2012 | Sato ....................... C03C 15/00 136/256 |

FOREIGN PATENT DOCUMENTS

| | | |
|---|---|---|
| JP | 04133360 A | 5/1992 |
| JP | 0951109 A | 2/1997 |
| JP | 2000-323733 A | 11/2000 |
| JP | 2009-021479 A | 1/2009 |
| KR | 10-2009-0017752 A | 2/2009 |
| KR | 10-0989615 B1 | 10/2010 |
| WO | WO-2008/154128 A1 | 12/2008 |
| WO | WO-2010/038482 A1 | 4/2010 |
| WO | WO-2010/097975 A1 | 9/2010 |

OTHER PUBLICATIONS

International Search Report in International Application No. PCT/KR2012/000001, filed Jan. 2, 2012.
Notice of Allowance dated Apr. 22, 2013 in Korean Application No. 10-2011-0007676, filed Jan. 26, 2011.
European Search Report dated Jun. 25, 2014 in European Application No. 12739578.8.
Office Action dated Apr. 28, 2015 in Chinese Application No. 201280015572.6.
Office Action dated Aug. 25, 2015 in Japanese Application No. 2013-551889.

* cited by examiner

[Fig. 1]
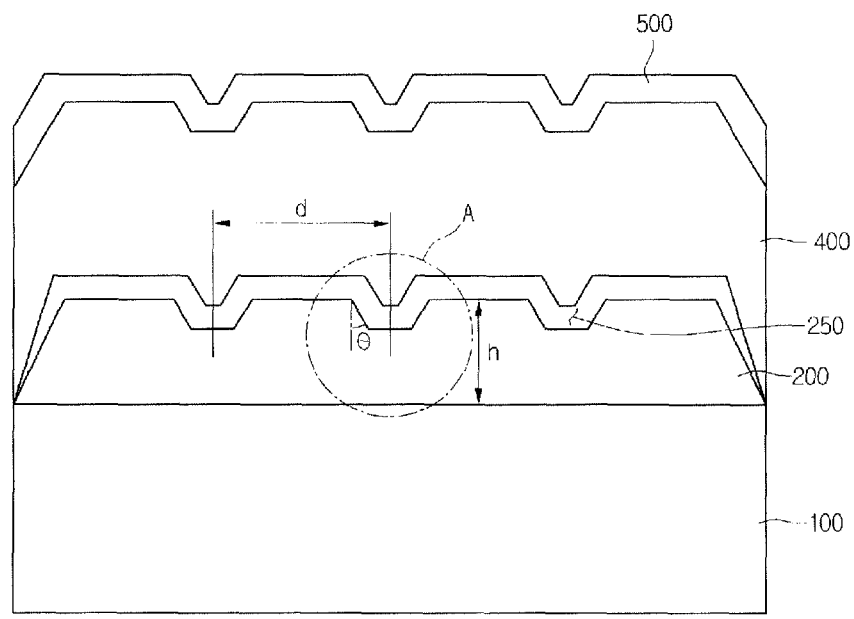
[Fig. 2]
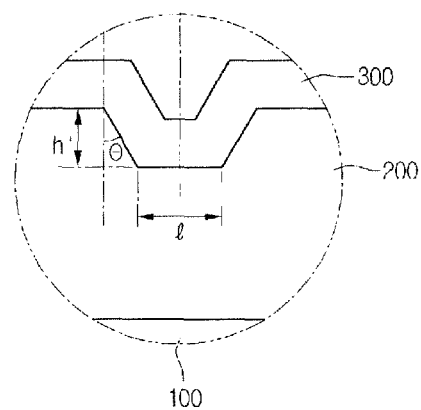
[Fig. 3]
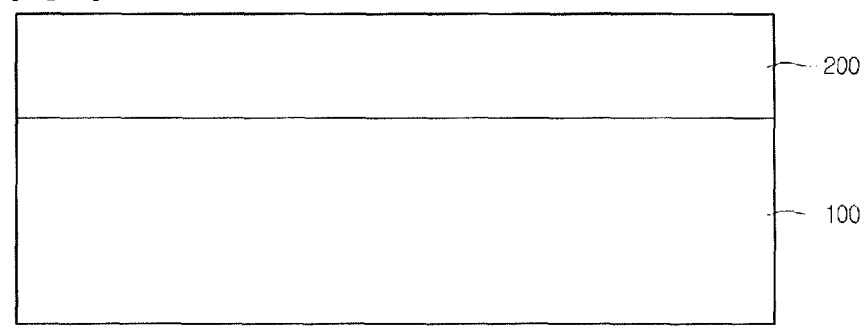

[Fig. 4]
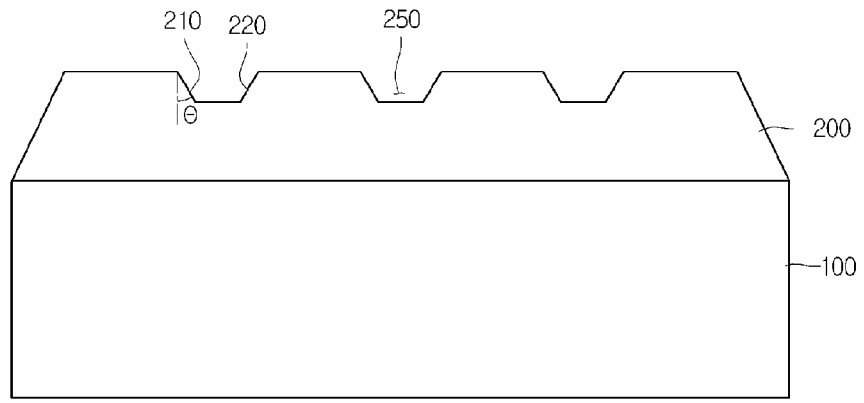
[Fig. 5]
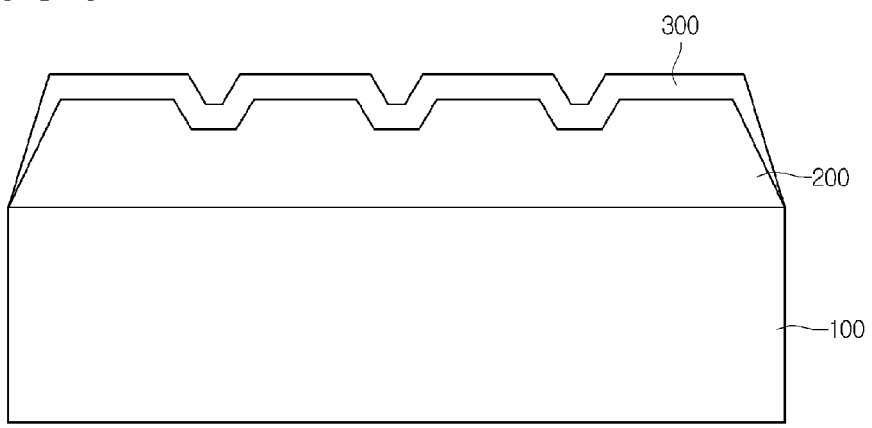
[Fig. 6]
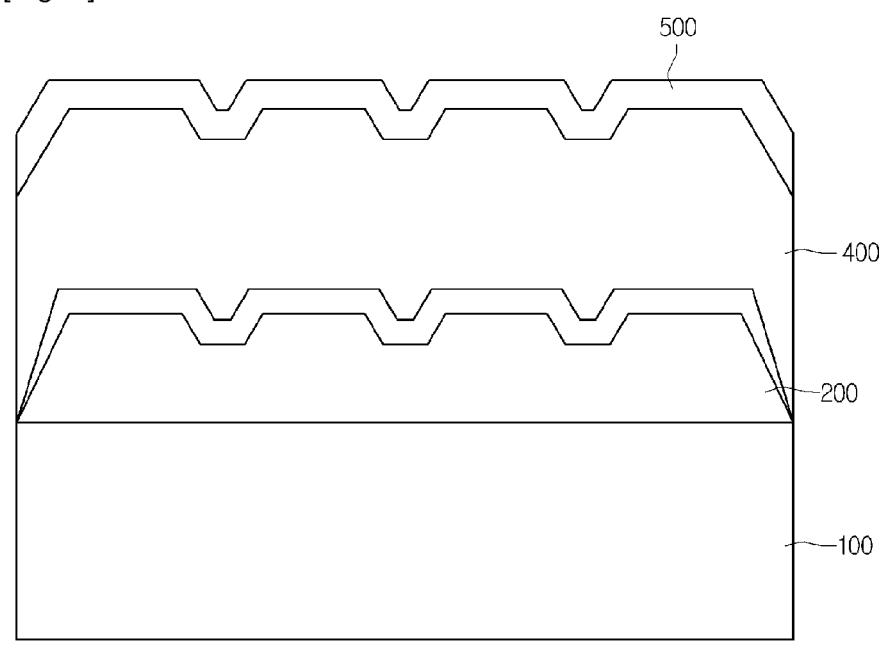

SOLAR CELL AND METHOD OF FABRICATING THE SAME

CROSS-REFERENCE TO RELATED APPLICATION

This application is the U.S. national stage application of International Patent Application No. PCT/KR2012/000001, filed Jan. 2, 2012, which claims priority to Korean Application No. 10-2011-0007676, filed Jan. 26, 2011, the disclosures of each of which are incorporated herein by reference in their entirety.

TECHNICAL FIELD

The present invention relates to a solar cell and a method of fabricating the same.

BACKGROUND ART

In recent, as the demand of the energy increases, developments for the solar cell converting solar energy into electrical energy are proceeding.

Particularly, a CIGS-base solar cell, that is, p-n hetero junction device having a substrate structure including a glass substrate, a metal backside electrode layer, p-type CIGS-base light absorption layer, a high-resistant buffer layer, n-type transparent electrode layer and the like is widely used.

Further, to increase the efficiency of the solar cell, various researches are proceeding.

DISCLOSURE OF INVENTION

Technical Problem

An advantage of some aspects of the invention is that it provides a solar cell apparatus and a method of fabricating the same having improved photoelectric conversion efficiency.

Solution to Problem

According to an aspect of the invention, there is provided a solar cell including a supporting substrate; a transparent electrode layer on the supporting substrate; a buffer layer on the transparent electrode layer; a light absorption layer on the buffer layer; a backside electrode layer on the light absorption layer; and a plurality of recesses formed on a top surface of the transparent electrode layer and having a first slope and a second slope.

According to another aspect of the invention, there is provided a method of fabricating a solar cell including forming a transparent electrode layer on a supporting substrate; forming a plurality of recesses including a first slope and a second slope on a top surface of the transparent electrode layer; forming a buffer layer on the transparent electrode layer; forming a light absorption layer on the buffer layer; and forming a backside electrode layer on the light absorption layer.

Advantageous Effects of Invention

In the embodiment, a solar cell with the increased surface area of a light absorption layer due to the etching of a substrate is provided. As a result, The solar cell efficiently absorbs solar-light outside, and has improved photoelectric conversion efficiency.

BRIEF DESCRIPTION OF DRAWINGS

FIG. 1 is a section view showing a solar cell according to an embodiment of the present invention.

FIG. 2 is a enlarged view of A portion in FIG. 1.

FIGS. 3 to 6 show the method of fabricating the solar cell.

MODE FOR THE INVENTION

In the description of the embodiment, in a case where each substrate, layer, a film or a electrode and the like is described to be formed "on" or "under" thereof, "on" or "under" also means one to be formed "directly" or "indirectly(through other component)" to component. Also, the criteria regarding "on" or "under" of each component will be described based on the drawings. In the drawing, the size of each component may be exaggerated to describe, and does not mean the size that is in fact applied.

FIG. 1 is a section view showing a solar cell according to an embodiment of the present invention, and FIG. 2 is a enlarged view of A portion in FIG. 1.

In FIGS. 1 and 2, the solar cell according to the embodiment includes a supporting substrate 100, a transparent electrode layer 200, a buffer layer 300, a light absorption layer 400 and a backside electrode layer 500.

A supporting substrate 100 has a plate shape, and supports the transparent electrode layer 200, the buffer layer 300, the light absorption layer 400 and the backside electrode layer 500.

The supporting substrate 100 may be an insulator. The supporting substrate 100 may be a glass substrate, a plastic substrate or a metal substrate. In more detail, the supporting substrate 100 may be a soda lime glass substrate.

When the supporting substrate 100 uses a soda lime glass, Na contained in the soda lime glass may be diffused into the light absorption layer 400 formed by the CIGS during the fabricating process of the solar cell, which allows charge concentration of the light absorption layer 400 to increase. That may be a factor that may increase photoelectric conversion efficiency of the solar cell.

In addition, a ceramic substrate such as alumina, stainless steel, flexible polymer and the like are used as the material of the supporting substrate 100. The supporting substrate 100 may be transparent and rigid or flexible.

The transparent electrode layer 200 may be formed on the supporting substrate 100. The transparent electrode layer 200, which is a conductive layer, is transparent, and may act as a window layer. The transparent electrode layer 200 includes oxide. For example, the transparent electrode layer 200 may include $In_2O_3$, ITO(indium-tin oxide), IGZO(indium-gallium-zinc oxide), ZnO, AZO(Aluminium-zinc oxide; ZnO:Al), $SnO_2$, FTO(Fluorine-doped tin oxide; $SnO_2$:F), ATO(Aluminium-tin oxide; $SnO_2$:Al and the like.

Further, the oxide may include conductive impurities such as aluminum(Al), alumina($Al_2O_3$), magnesium(Mg) or gallium(Ga). In more detail, the transparent electrode layer 200 may include Al doped zinc oxide; AZO, or Ga doped zinc oxide; GZO and the like.

A plurality of recesses 250 are formed on a top surface of the transparent electrode layer 200. The plurality of recesses 250 may be formed by etching a portion of the transparent electrode layer 200.

When areas of the transparent electrode layer 200 and the light absorption layer 400 are increased by the plurality of recesses 250 and therefore, an incident angle of solar-light changes over time, the effective area that may absorb the light according to the incident angle of the solar-light is increased, thereby increasing power generation time.

It is preferable to form spacings d between the plurality of recesses 250 as the range of 1 μm to 2 μm If the thickness h of the transparent electrode layer 200 is too thick, the transmission of the solar cell may be lowered, so it is preferable to form the thickness h of the transparent electrode layer 200 as the range of 0.5 to 1 μm.

The plurality of recesses 250 may have each different forming length within above range. The thickness of the plurality of recesses 250 may have the range 10% to 70% of the thickness of the transparent electrode layer 200.

The transparent electrode layer 200 is protruded by the plurality of recess 250, and the buffer layer 300, the light absorption layer 400 and the backside electrode layer 500 laminated on the transparent electrode layer 200 are successively protruded in corresponding to the positions formed with the plurality of recesses 250 to form a waffle structure. In this case, the section thereof may be formed as a quadrangle, but is not limited thereto.

The transparent electrode layer 200 has the protrusion structure allowing the width to be narrowed to the top by the plurality of recess 250. Further, in contrast, it is possible to form the transparent electrode layer 200 as the shape allowing the width to be widen to the top.

As a result, the area of the light absorption layer 400 absorbing light by the plurality of the recesses 250 is increased, thereby efficiently absorbing solar-light outside and improving photoelectric conversion efficiency.

The buffer layer 300 is arranged on the transparent electrode layer 200. Like the present invention, the solar cell having CIGS compound as the light absorption layer 400 forms p-n junction between a p-type semiconductor, that is, a CIGS compound thin film and a n-type semiconductor, that is, a transparent electrode layer 200 thin film. However, since two materials have large difference in a lattice constant and bandgap energy, to form good junction, a buffer layer to be positioned in the middle of the two materials is necessary due to the difference in the bandgap.

Cadium sulfide (CdS) may be used as the material for the buffer layer 300, but ZnS, MnS, Zn(O,S), ZnSe, (Zn,In)Se, In(OH,S), $In_2S_2$ and the like that do not use Cd of heavy metals may be used. To form the buffer layer 300, a chemical bath deposition method or a ILGAR(ion layer gas reaction) method or a vacuum deposition method is used. The buffer layer 300 may be the thickness of 10-500 nm. The buffer layer 300 helps in terms of efficiency improvement, but is not necessary when operating the solar cell.

The light absorption layer 400 may be formed on the buffer layer 300. The light absorption layer 400 includes p-type semiconductor compound. In more detail, the light absorption layer 400 includes group I-III-VI-base compound. For example, The light absorption layer 400 may have Cu—In—Ga—Se-base(Cu(In,Ga)Se$_2$; CIGS-base), Cu—In—Se-base or Cu—Ga—Se-base crystal structure. The energy band gap of the light absorption layer 400 may be about 1 eV to 1.8 eV.

The backside electrode layer 500 may be formed on the light absorption layer 400. The backside electrode layer 500 becomes a conductive layer. The backside electrode layer 500 allows charges produced from the light absorption layer 400 of the solar cell to move, such that current may flow outside the solar cell. The backside electrode layer 500 should be have high electrical conductivity and small specific resistance to perform above function.

Further, The backside electrode layer 500 should be maintained to have high temperature stability when heat-treating under the atmosphere of sulfur(S) or selenium(Se) accompanied in forming CIGS compound.

Such a backside electrode layer 500 may be formed by any one of molybdenum (Mo), gold (Au), aluminum (Al), chromium (Cr), tungsten (W) and copper (Cu) Among them, particularly, the molybdenum (Mo) may allow the characteristic required for the backside electrode layer 500 to generally satisfy.

The backside electrode layer 500 may include at least two layers. In this case, each layer may be formed by same metals or metals different from each other.

The solar cell of the embodiment of the invention includes the light absorption layer having curves, thereby efficiently absorbing the amount of the light incident to the solar cell and therefore improving the photoelectric conversion efficiency.

Further, on the contrary to the existing thin-film solar cell structure, since the window layer contacts the transparent substrate, the difference in the refractive index of air/glass/the transparent electrode layer is gently formed and therefore the reflection loss of the light incident to the solar cell is small, thereby improving the photoelectric conversion efficiency. The window layer is oxidized by water ($H_2O$) or oxygen($O_2$) and the like, thereby preventing deterioration of the electrical properties and therefore providing the solar cell having improved reliability.

FIGS. 3 to 6 are sectional views showing the method of fabricating the solar cell according to an embodiment of the present invention. The description regarding the present fabricating method refers to the description regarding the solar cell described previously. The description regarding the solar cell described previously may be essentially combined to the description regarding the manufacturing method of the present invention.

As shown in FIG. 3, the window layer 200 may be formed on the supporting substrate 100. The window layer 200 is deposited by a CVD process or a sputtering process.

In FIGS. 2 and 4, the plurality of the recesses 250 may be formed by etching the portion of the window 200.

For example, mask patterns are formed on the window layer 200. The mask patterns may be formed by a photolithographic process. For example, photosensitive resin is coated on the window 200 to form photo-resist film. The portion of the photo-resist film is exposed and etched to form the mask patterns.

The mask patterns have an island shape. That is, the mask patterns include a number of masks having the island shape. In this case, the masks are spaced apart from each other. Further, the masks may be arranged in a matrix type.

The plurality of recesses 250 may be formed by, for example, etching process. Etching solution is made by mixing fluoride, sulfuric acid, and nitric acid. That is, the concentration of the fluoride is set as 10~25 wt %, and a mixed acid solution added with the acid such as sulfuric acid 15 wt %, nitric acid 15 wt % and the like is manufactured. The plurality of recesses 250 may be formed by etching at room temperature during about 10 minutes with the etching solution manufactured above.

It is preferable that the depth h' of the plurality of recesses 250 is formed at under half of the thickness of the window layer 200, but is not limited thereto.

The plurality of recesses 250 may include a first slope 210 and a second slope 220. An angle (θ) formed by a normal of the supporting substrate 100 and the first slope 210 may be formed in the range of 1°<θ<45°.

Further, when looking into the angle (θ) formed by the normal of the supporting substrate 100 and the first slope 210 in relation to the plurality of recesses 250, if (θ) value is larger than necessary, which limits the increasing of the effective area, thereby to preferably form the angle (θ) as the range of $1°<θ<\tan^{-1}(d/h)$.

A bending surface l forming a slope with a first slope 210 and a second slope 220 may be formed by the forming process of the recesses 250. The width of the bending surface l may be reduced as the θvalue increases, the bending surface l is not formed at a critical angle at which the first slope 210 contacts the second slope 220. The bending surface l may be parallel to the supporting substrate 100.

The first slope 210 and the second slope 220 are slopes when the section thereof is viewed from the front, and a third slope and a fourth slope(not shown) may be formed adjacently to the first slope 210 and the second slope 220.

That is, The first slope 210 and the second slope 220 face each other, and the third slope and the fourth slope may be formed to be faced each other. The angle of the third slope and the fourth slope may be formed by the same angle as the first slope 210 and the second slope 220.

The recess may be formed by the first, second, third and fourth slopes, and a plurality of protrusions formed by them may have pyramid shape. In more detail, the plurality of protrusions may have a polygonal pyramid shape. In more detail, the plurality of protrusions may have a polygonal pyramid shape. Further, a top surface of the protrusion formed by the first, second, third and fourth slopes may have a quadrangular shape.

In FIG. 5, the buffer layer 300 may be formed on the window layer 200. The buffer layer 300 may be formed by depositing cadmium sulfide by the sputtering process or the chemical bath deposition(CBD) method.

In FIG. 6, the light absorption layer 400 and the backside electrode layer 500 are formed on the buffer layer 300.

The light absorption layer 400 is widely fabricated by the method forming the light absorption layer 400 of Cu—In—Ga—Se-base(Cu(In,Ga)Se$_2$; CIGS-base) while simultaneously or separately evaporating, for example, Cu, In, Ga and Se, and the method using a selenization process after forming a metal precursor film.

In contrast, CIS-base or CIG-base light absorption layer 400 may be formed by the sputtering process using only the Cu target and the In target or the Cu target and the Ga target, and the selenization process.

Next, the backside electrode layer 500 may be formed on the light absorption layer 400. The backside electrode layer 500 may be formed by PVD(Physical Vapor Deposition) or plating using molybdenum.

The solar cell having the improved light absorptance may be provided according to the embodiment of the present invention.

It is appreciated that the present invention can be carried out in other specific forms without changing a technical idea or essential characteristics by one having ordinary skilled in the art to which the present invention pertains to. Therefore, embodiments described above are for illustration purpose in all respect but not limited to them. The scope of the present invention is represented by claims described below rather than the detailed description, and any change and variations derived from the meaning, the scope and the concept of equality of claims should be interpreted to be included to the scope of the present invention.

In addition, although the preferred embodiments of the present invention are shown and described above, the present invention is not limited to above-described specific embodiment and is variously modified by one skilled in the art without the gist of the present invention claimed in the claim, such that the modified embodiment is not to be understood separately from technical ideas or views of the present invention.

INDUSTRIAL APPLICABILITY

The present invention relates to a solar cell and a method of fabricating the same.

The invention claimed is:

1. A solar cell, comprising:
a supporting substrate;
a transparent electrode layer on the supporting substrate;
a buffer layer on the transparent electrode layer;
a light absorption layer on the buffer layer; and
a backside electrode layer on the light absorption layer,
wherein a band gap of the light absorption layer is in a range of 1eV to 1.8eV,
wherein the buffer layer includes one of CdS, MnS, (ZnO,S), ZnSe, (Zn,In)Se, In(OH,S), and In$_2$S$_2$;
wherein a top surface of the transparent electrode layer is formed with a plurality of first recesses and a plurality of flat surface, wherein a first flat surface of the plurality of flat surface is disposed between two adjacent recesses of the plurality of first recesses;
wherein a top surface of the buffer layer is formed with a plurality of second recesses;
wherein a top surface of the light absorption layer is formed with a plurality of third recesses;
wherein a top surface of the backside electrode layer is formed with a plurality of fourth recesses;
wherein each of the plurality of first recesses includes:
a first slope;
a second slope; and
a first bending surface between the first slope and the second slope,
wherein the first bending surface is in parallel to the supporting substrate,
wherein a thickness of the transparent electrode layer is in a range of 0.5 μm to 1 μm;
wherein each of the plurality of first recesses has a thickness in a range of 10% to 70% of the thickness of the transparent electrode layer,
wherein spaces between centers of the plurality of first recesses are in a range of 1 μm to 2 μm,
wherein a width of the transparent electrode layer decreases from a bottom surface of the transparent electrode layer in contact with the supporting substrate toward a topmost surface of the transparent electrode layer opposite the supporting substrate,
wherein a first angle (θ) formed by a normal of the supporting substrate and the first slope is in a range of 1°<θ<45°,
wherein a width of the first flat surface is greater than a width of the first bending surface,
wherein a distance between the top surface of the transparent electrode layer and the top surface of the buffer layer decreases from a center portion of the solar cell toward an edge portion of the solar cell, forming a tapered region in the transparent electrode layer at the edge portion of the solar cell,
wherein a distance between the top surface of the buffer layer and the top surface of the light absorption layer increases from the center portion of the solar cell toward the edge portion of the solar cell, wherein a distance between the top surface of the light absorption layer and the top surface of the backside electrode layer is a constant, wherein a width of each of the plurality of first recesses is greater than a width of each of the plurality of second recesses, and wherein a width of each of the plurality of the third recesses is greater than a width of each of the plurality of fourth recesses.

2. The solar cell according to claim 1, wherein when the spaces between centers of the plurality of first recesses is d, and the thickness of the transparent electrode layer is h, the first angle ($\theta$) is formed in a range of $1°<\theta<\tan^{-1}(d/h)$.

3. The solar cell according to claim 1, wherein widths of each of the plurality of first recesses increase from a bottom portion toward a top portion of each of the plurality of first recesses.

4. The solar cell according to claim 1, wherein the first bending surface is formed in a bottom portion of each of the plurality of first recesses and makes direct contact with the first slope and the second slope.

5. The solar cell according to claim 1, wherein the first slope and the second slope face each other, the first slope and the second slope are adjacent to a third slope and a fourth slope, respectively, and the third slope and the fourth slope face each other.

6. The solar cell according to claim 5, wherein protrusions are formed by the first, second, third and fourth slopes.

7. The solar cell according to claim 1, wherein a width of each of the plurality of second recesses, third recesses, and fourth recesses increases from a bottom portion toward a top portion of each of the plurality of second recesses, third recesses, and fourth recesses.

8. The solar cell according to claim 1, wherein each of the plurality of first recesses includes:
 a fifth slope;
 a sixth slope; and
 a second bending surface between the fifth slope and the sixth slope,
wherein the second bending surface is in parallel to the supporting substrate and the first bending surface.

9. The solar cell according to claim 1, wherein the plurality of first recesses respectively corresponds to the plurality of second recesses, the plurality of third recesses, and the plurality of fourth recesses.

* * * * *